(12) United States Patent
Lim et al.

(10) Patent No.: US 10,547,285 B2
(45) Date of Patent: Jan. 28, 2020

(54) BULK ACOUSTIC WAVE RESONATOR AND METHOD OF MANUFACTURING THE SAME

(71) Applicant: SAMSUNG ELECTRO-MECHANICS CO., LTD., Suwon-si (KR)

(72) Inventors: Chang Hyun Lim, Suwon-si (KR); Yoon Sok Park, Suwon-si (KR); Jong Woon Kim, Suwon-si (KR); Tae Yoon Kim, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 88 days.

(21) Appl. No.: 15/809,696

(22) Filed: Nov. 10, 2017

(65) Prior Publication Data

US 2018/0309428 A1 Oct. 25, 2018

(30) Foreign Application Priority Data

Apr. 19, 2017 (KR) .................. 10-2017-0050608

(51) Int. Cl.
*H03H 9/17* (2006.01)
*H03H 9/05* (2006.01)
(Continued)

(52) U.S. Cl.
CPC .............. *H03H 9/173* (2013.01); *H03H 3/02* (2013.01); *H03H 9/02015* (2013.01);
(Continued)

(58) Field of Classification Search
CPC ........... H03H 9/02015; H03H 9/02094; H03H 9/02157; H03H 9/0514; H03H 9/173;
(Continued)

(56) References Cited

U.S. PATENT DOCUMENTS 7,212,082 B2 * 5/2007 Nagao .................. H01L 41/316
310/324
7,456,709 B2 * 11/2008 Jung ........................ H03H 3/02
310/324

(Continued)

FOREIGN PATENT DOCUMENTS

| KR | 10-0662865 B1 | 1/2007 |
| KR | 10-2014-0126696 A | 10/2014 |
| WO | WO 2013/086083 A1 | 6/2013 |

*Primary Examiner* — Barbara Summons
(74) *Attorney, Agent, or Firm* — NSIP Law (57) ABSTRACT

A bulk acoustic wave resonator includes a substrate including a cavity groove, a membrane layer disposed above the substrate and including a convex portion. And a lower electrode including a portion thereof disposed on the convex portion. The bulk acoustic wave resonator also includes a piezoelectric layer configured so that a portion of the piezoelectric layer is disposed above the convex portion, and an upper electrode disposed on the piezoelectric layer. A first space formed by the cavity groove and a second space formed by the convex portion form a cavity, the cavity groove is disposed below an active region, and the convex portion comprises an inclined surface disposed outside of the cavity groove.

20 Claims, 9 Drawing Sheets

(51) Int. Cl.
*H03H 9/02* (2006.01)
*H03H 3/02* (2006.01)

(52) U.S. Cl.
CPC .... *H03H 9/02094* (2013.01); *H03H 9/02118* (2013.01); *H03H 9/0514* (2013.01); *H03H 9/174* (2013.01); *H03H 2003/021* (2013.01)

(58) Field of Classification Search
CPC ........ H03H 9/174; H03H 9/587; H03H 9/588; H03H 3/02; H03H 2003/021; H03H 2003/023
USPC ......... 333/187, 189; 310/322, 324, 348, 349
See application file for complete search history.

(56) References Cited

U.S. PATENT DOCUMENTS

| | | | |
|---|---|---|---|
| 8,854,156 B2 * | 10/2014 | Iwashita | H03H 3/02 310/312 |
| 2003/0015941 A1 | 1/2003 | Nakatani et al. | |
| 2005/0077803 A1 | 4/2005 | Ha et al. | |
| 2011/0121915 A1 * | 5/2011 | Miller | H03H 3/04 333/187 |
| 2013/0027153 A1 * | 1/2013 | Shin | H03H 9/02102 333/133 |
| 2014/0225683 A1 | 8/2014 | Burak et al. | |
| 2017/0170233 A1 * | 6/2017 | Tsai | H01L 27/20 |
| 2018/0048281 A1 * | 2/2018 | Lee | H01L 41/047 |

\* cited by examiner

BULK ACOUSTIC WAVE RESONATOR AND METHOD OF MANUFACTURING THE SAME

CROSS-REFERENCE TO RELATED APPLICATION(S)

This application claims benefit under 35 USC 119(a) of priority to Korean Patent Application No. 10-2017-0050608 filed on Apr. 19, 2017 in the Korean Intellectual Property Office, the disclosure of which is incorporated herein by reference in its entirety.

BACKGROUND

1. Field

The following description relates to a bulk acoustic wave resonator and a method of manufacturing the same.

2. Description of Related Art

In general, a space, which may be secured for resonance in bulk acoustic resonators, is determined by thicknesses of sacrificial layers.

Also, as sacrificial layer thicknesses are further reduced, there is a high possibility that resonant portions and substrates may be stuck during manufacturing processes, increasing constraints on structures and process designs.

On the other hand, as the thicknesses of sacrificial layers increase, the possibility of occurrence of stiction between resonant portions and substrates may be reduced. However, increasing the thickness of a sacrificial layer unconditionally may not be feasible in terms of a manufacturing process.

For example, in order to fabricate a resonant structure for the generation of resonance, a plurality of thin films are deposited on a sacrificial layer. To this end, the sacrificial layer is inclined by slope etching. However, as the thickness of a sacrificial layer increases, the length of an inclined surface of the sacrificial layer also increases, which leads to an increase in the size of an overall filter device, as well as, a respective resonator. In addition, as the thickness of the sacrificial layer increases, characteristic deterioration may be easily caused due to an increase in a length of a connection portion between resonators.

Furthermore, because increasing the thickness of a sacrificial layer causes an increase in a size of a step to correspond to the increased thickness in a subsequent process, a problem of negative properties in terms of process accuracy may occur.

Thus, the development of a structure, in which the occurrence of stiction of a substrate may be reduced and a problem caused by the increase in a thickness of a sacrificial layer may also be solved, is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a bulk acoustic wave resonator that prevents stiction between a substrate and a membrane layer, and a method of manufacturing the same.

In accordance with an example, there is provided a bulk acoustic wave resonator, including: a substrate comprising a cavity groove; a membrane layer disposed above the substrate and comprising a convex portion; a lower electrode comprising a portion thereof disposed on the convex portion; a piezoelectric layer configured so that a portion of the piezoelectric layer may be disposed above the convex portion; and an upper electrode disposed on the piezoelectric layer, wherein a first space formed by the cavity groove and a second space formed by the convex portion form a cavity, the cavity groove may be disposed below an active region, and the convex portion may include an inclined surface disposed outside of the cavity groove.

The cavity groove may be sized to be disposed in a central portion of the active region.

The cavity groove may be configured to have a size corresponding to the convex portion.

The convex portion may include a support layer formed therearound so that the lower electrode may be disposed on a flat surface.

The support layer may be formed of a material comprising silicon nitride (SiN) or silicon oxide (SiO2) or a material comprising relatively low reactivity to a halide-based etching gas.

The bulk acoustic wave resonator may also include: a metal pad configured to be connected to a portion of the lower electrode and a portion of the upper electrode; and a passivation layer disposed on the lower electrode excluding a region in which the metal pad may be formed.

The upper electrode may be provided with a frame portion formed thereon so that the frame portion may be disposed at an edge of the active region.

A volume of the first space may be greater than a volume of the second space.

The active region may include a region in which the lower electrode, the piezoelectric layer, and the upper electrode are laminated.

In accordance with an example, there is provided a method of manufacturing a bulk acoustic wave resonator, including: forming a cavity groove in a substrate; forming a substrate protective layer on the substrate; forming a sacrificial layer portion on the substrate protective layer; forming a sacrificial layer by removing a portion of the sacrificial layer portion; forming a membrane layer to cover the sacrificial layer; forming a resonant portion on the membrane layer; and forming a cavity by removing the sacrificial layer.

The forming a resonant portion may include: forming a lower electrode on the membrane layer so that a portion of the lower electrode may be disposed above the sacrificial layer; forming a piezoelectric layer above the sacrificial layer to cover a portion of the lower electrode; forming an upper electrode on the piezoelectric layer; forming a passivation layer to expose a portion of the lower electrode and a portion of the upper electrode; and forming a metal pad on the exposed portion of the lower electrode and the exposed portion of the upper electrode.

The forming a sacrificial layer may include: planarizing an upper surface of the sacrificial layer portion; and removing a portion of the sacrificial layer portion, excluding a region thereof remaining as the sacrificial layer.

The forming a sacrificial layer may include: planarizing an upper surface of the sacrificial layer portion; and forming a depression groove in the sacrificial layer portion and around the sacrificial layer.

The method may also include: forming a support layer in the depression groove.

The forming of the cavity may include forming a first space by the cavity groove and forming a second space by a convex portion of the membrane layer.

The cavity groove may be sized to be disposed in a central portion of an active region.

The cavity groove may be formed to have a size corresponding to a size of the convex portion.

The upper electrode may include a frame portion formed thereon so that the frame portion may be disposed at an edge of an active region.

The method may also include: forming an active region in a region in which the lower electrode, the piezoelectric layer, and the upper electrode are laminated.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 1:
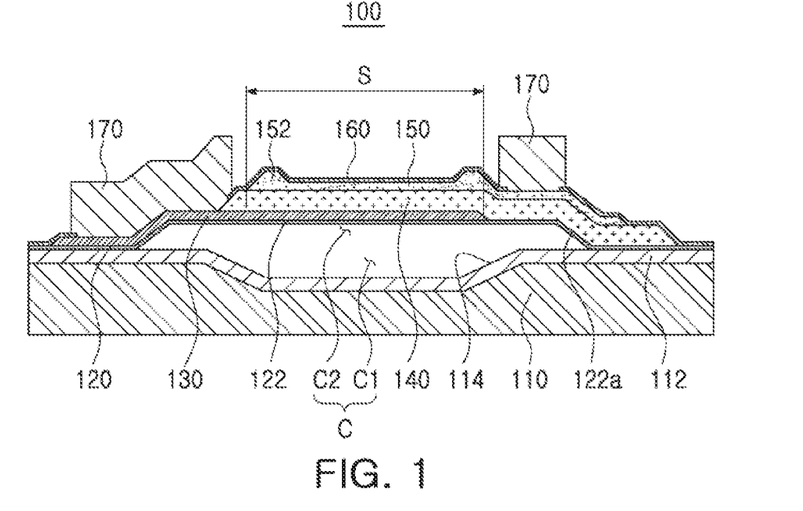
FIG. 1 is a schematic cross-sectional view of a bulk acoustic wave resonator, according to a first example.

FIG. 1 is a schematic cross-sectional view of a bulk acoustic wave resonator, according to an example.

With reference to FIG. 1, a bulk acoustic wave resonator 100 according to a first example is configured to include a substrate 110, a membrane layer 120, a lower electrode 130, a piezoelectric layer 140, an upper electrode 150, a passivation layer 160, and a metal pad 170.

The substrate 110 is a silicon-accumulated substrate. For example, a silicon wafer may be used as the substrate. The substrate 110 is disposed or provided with a substrate protective layer 112 thereon, to prevent damage to the substrate 110 when a cavity C is formed. The substrate protective layer 112 prevents the substrate 110 from being etched during a process of removing a sacrificial layer 180 (see FIGS. 6 to 13) to be described later. For purposes of description, the term disposed will be used to describe the formation and disposition of the various layers and elements described in the present description.

A cavity formation groove or a cavity groove 114 is formed in the substrate 110. The cavity groove 114 prevents stiction between the membrane layer 120 and the substrate 110 during resonance of the membrane layer 120 to be later described.

For example, the stiction between the membrane layer 120 and the substrate 110 during the resonance of a resonant portion is prevented through the cavity groove 114 formed to be recessed from the substrate 110.

The cavity groove 114 is disposed below an active region S to prevent stiction between the membrane layer 120 and the substrate 110 when a resonant portion vibrates.

In this case, the active region S refers to a region in which all three layers of the lower electrode 130, the piezoelectric layer 140, and the upper electrode 150 are laminated. The resonant portion refers to a region in which vibrations are generated, and refers to a region corresponding to the active region S.

Further, the cavity groove 114 is formed to be tapered. A first space C1 is formed through the cavity groove 114. As described above, because the first space C1 forming the cavity C is formed through the cavity groove 114, a problem occurring due to an increase in a thickness of a sacrificial layer 180 (see FIG. 4) is resolved. For example, a length of an inclined surface of the sacrificial layer 180 is prevented from increasing due to the increase in a thickness of the sacrificial layer.

In addition, the cavity groove 114 has a size corresponding to a size of the active region S described above. As an example, the cavity groove 114 corresponds to a central portion of the convex portion 122 to be described later, but is not limited thereto. For example, the cavity groove 114 may have a size that varies from a size that corresponds to a central portion of the convex portion 122 to a size corresponding to a size of the convex portion 122.

The membrane layer 120 is formed on the substrate 110 and has the convex portion 122. The convex portion 122, together with the substrate 110, forms a second space C2. The cavity C includes the first space C1 formed by the cavity groove 114, and the second space C2 formed by the convex portion 122.

Further, an edge of the convex portion 122 is formed to have an inclined surface 122a.

In addition, the membrane layer 120 is formed to cover the sacrificial layer 180 in a fabrication process, and then, the second space C2 is formed below the membrane layer 120 by removing the sacrificial layer 180.

The membrane layer 120 is formed of a material having relatively low reactivity with a halide-based etching gas such as fluorine (F), chlorine (Cl) or the like to remove the silicon-based sacrificial layer 180.

In one example, a volume of the first space C1 is formed to be greater than a volume of the second space C2. Thus, the resonant portion stably and simultaneously resonates, thus, preventing stiction between the membrane layer 120 and the substrate 110 during resonance of the resonant portion.

In one example, the inclined surface 122a of the convex portion 122 is formed to be disposed outwardly of the cavity groove 114.

The lower electrode 130 is formed on the membrane layer 120, and at least a portion of the lower electrode 130 is located above the cavity C. As an example, the lower electrode 130 is formed using a conductive material, such as molybdenum (Mo), ruthenium (Ru), tungsten (W), iridium (Ir), platinum, and the like, or alloys thereof.

The lower electrode 130 is used as either an input electrode or an output electrode, receiving or outputting an electrical signal, such as a radio frequency (RF) signal or the like. For example, when the lower electrode 130 is an input electrode, the upper electrode 150 is an output electrode, and when the lower electrode 130 is an output electrode, the upper electrode 150 is an input electrode.

The piezoelectric layer 140 is formed to cover at least a portion of the lower electrode 130. The piezoelectric layer 140 converts a signal input through the lower electrode 130 or the upper electrode 150 into acoustic waves. For example, the piezoelectric layer 140 serves to convert electrical signals into acoustic waves through physical vibrations.

For example, the piezoelectric layer 140 is formed by depositing aluminum nitride, doped aluminum nitride, zinc oxide, or lead zirconate titanate.

In addition, when the piezoelectric layer 140 is formed of aluminum nitride (AlN), the piezoelectric layer 140 further includes a rare earth metal. For example, as the rare earth metal, at least one of scandium (Sc), erbium (Er), yttrium (Y), and lanthanum (La) may be used. In addition, when the piezoelectric layer 140 is formed of aluminum nitride (AlN), the piezoelectric layer 140 further includes a transition metal. For example, as the transition metal, at least one of zirconium (Zr), titanium (Ti), magnesium (Mg), and hafnium (Hf) may be used.

The upper electrode 150 may be formed to cover the piezoelectric layer 140, and may be formed using a conductive material, such as molybdenum (Mo), ruthenium (Ru), tungsten (W), iridium (Ir), platinum (Pt), or the like, or alloys thereof, in a manner similar to the lower electrode 130.

On the other hand, a frame portion 152 is provided on the upper electrode 150. The frame portion 152 refers to a portion of the upper electrode 150, having a thickness greater than a thickness of a remaining portion of the upper electrode 150. The frame portion 152 is disposed on the upper electrode 150, in such a manner that the frame portion is disposed in a region of the active region S, excluding a central portion of the active region S, that is, at an edge of the active region S.

The frame portion 152 serves to reflect lateral waves generated during resonance to an interior of the active region S, thus, confining resonance energy in the active region S. In other words, the frame portion 152 is formed to be disposed at an edge of the active region S, to prevent vibrations from escaping externally from the active region S.

A passivation layer 160 is formed at least on the piezoelectric layer 140 and the upper electrode 150. For example, the passivation layer 160 is formed in a region except for portions of the lower electrode 130 and the upper electrode 150 on which the metal pad 170 is formed.

Furthermore, a thickness of the passivation layer 160 is adjusted by etching in an ultimate process to control a passing-frequency band.

The metal pad 170 is formed on portions of the lower electrode 130 and the upper electrode 150, on which the passivation layer 160 is not formed. As an example, the metal pad 170 is formed of a material, such as gold (Au), a gold-tin (Au—Sn) alloy, copper (Cu), a copper-tin (Cu—Sn) alloy, or the like.

As described above, stiction between the substrate 110 and the membrane layer 120 is prevented through the cavity C of which a volume is increased compared to existing bulk acoustic wave resonators. For example, as the volume of the cavity C is increased through the cavity groove 114 formed in the substrate 110, the membrane layer 120 is prevented from being stuck to the substrate 110. In other words, stiction therebetween may be prevented.

Figure 4:
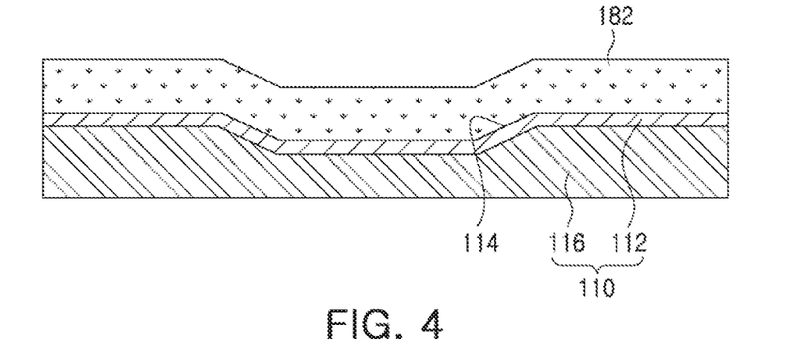

In addition, even when the volume of the cavity C is increased, as described above, a problem occurring due to an increase in a thickness of the sacrificial layer 180 (see FIG.

4) in a fabrication process is resolved. For example, a length of an inclined surface of the sacrificial layer 180 is prevented from increasing due to the increase in a thickness of the sacrificial layer as the volume of the cavity C increases.

As a result, an increase in a size of the bulk acoustic wave resonator 100 is reduced, thus, suppressing an increase in an overall size of a filter device. Furthermore, characteristics deterioration is prevented from occurring due to an increase in a length of a connection portion between the bulk acoustic wave resonators 100.

FIGS. 2 to 13 are process drawings illustrating a method of manufacturing a bulk acoustic wave resonator, according to an example.

Figure 2:
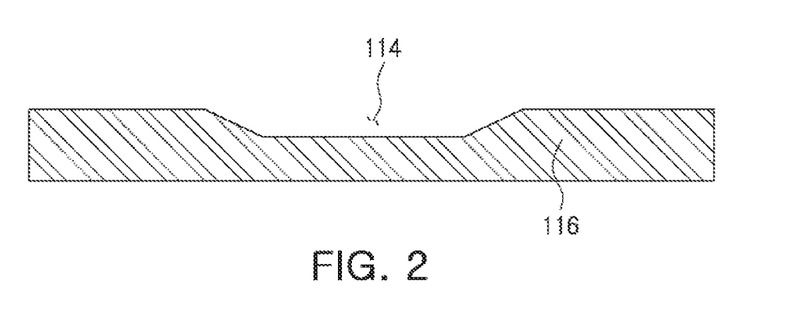
FIGS. 2 to 13 are process drawings illustrating a method of manufacturing a bulk acoustic wave resonator, according to an example.

First, as illustrated in FIG. 2, a cavity groove 114 is formed in a base part 116 of the substrate 110. The cavity groove 114 is formed on the base part 116 as an indentation on an upper surface of the base part 166. The cavity groove 114 may be formed to be tapered.

Figure 3:
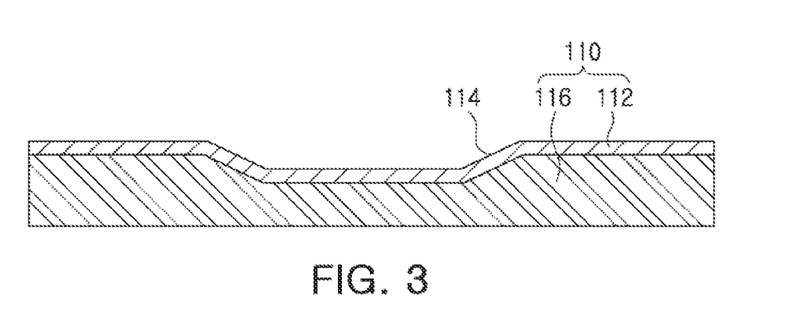

Also, as illustrated in FIG. 3, a substrate protective layer 112 is formed on the base part 116 of the substrate 110. The substrate protective layer 112 serves to prevent the substrate 110 from being etched during a process of removing a sacrificial layer 180 (see FIGS. 6 to 13) to be later described.

As illustrated in FIG. 4, a sacrificial layer portion or a sacrificial layer formation portion 182 is formed on the substrate protective layer 112. The sacrificial layer portion 182 is also formed to be inserted into the cavity groove 114.

As an example, the sacrificial layer portion 182 may be formed of a material containing polysilicon or silicon oxide.

Figure 5:
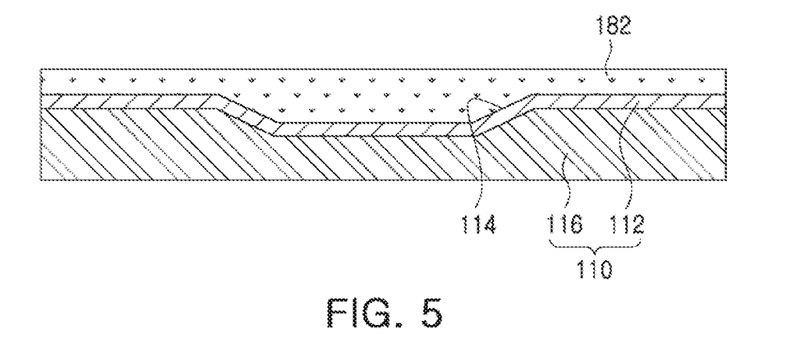

Then, as illustrated in FIG. 5, the sacrificial layer portion 182 is planarized. The planarization process is performed by chemical mechanical polishing (CMP).

Figure 6:
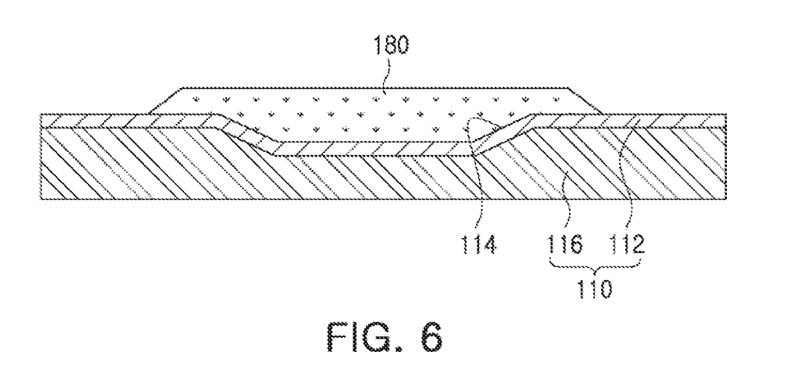

Subsequently, as illustrated in FIG. 6, a sacrificial layer 180 is formed through patterning of the sacrificial layer portion 182. For example, a shape of the sacrificial layer 180 is formed by removing the sacrificial layer portion 182 in a region excluding a region of the sacrificial layer 180.

Figure 7:
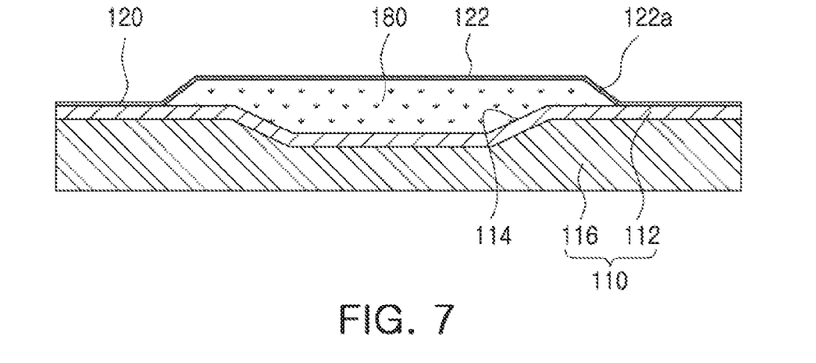

Then, as illustrated in FIG. 7, a membrane layer 120 is formed. The membrane layer 120 is formed to cover the sacrificial layer 180 and; thus, a convex portion 122 is formed on the membrane layer 120. Further, the convex portion 122 has an inclined surface 122a.

Figure 8:
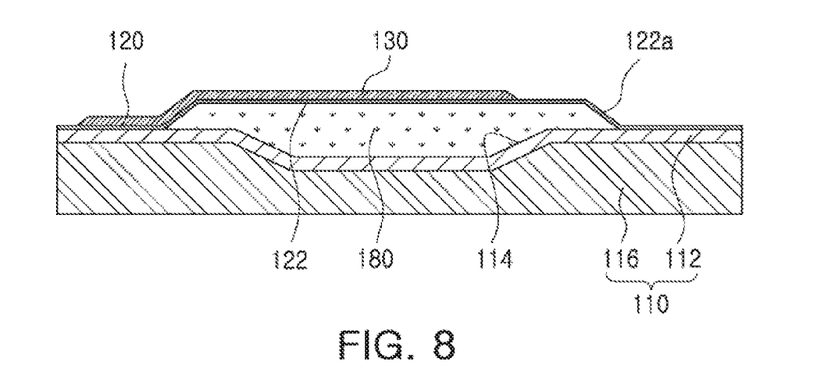

As illustrated in FIG. 8, a lower electrode 130 is formed on the membrane layer 120 so that a portion of the lower electrode 130 is disposed above the sacrificial layer 180. The lower electrode 130 is formed to extend outwardly of the sacrificial layer 180.

Figure 9:
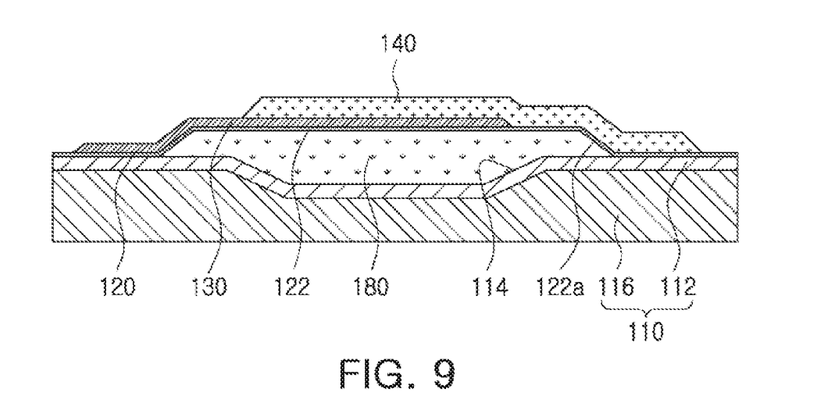

Subsequently, as illustrated in FIG. 9, a piezoelectric layer 140 is formed. The piezoelectric layer 140 is formed such that a portion thereof is disposed above the sacrificial layer 180. The portion of the piezoelectric layer 140 disposed above the sacrificial layer 180 is formed on at least a portion of the lower electrode 130.

Figure 10:
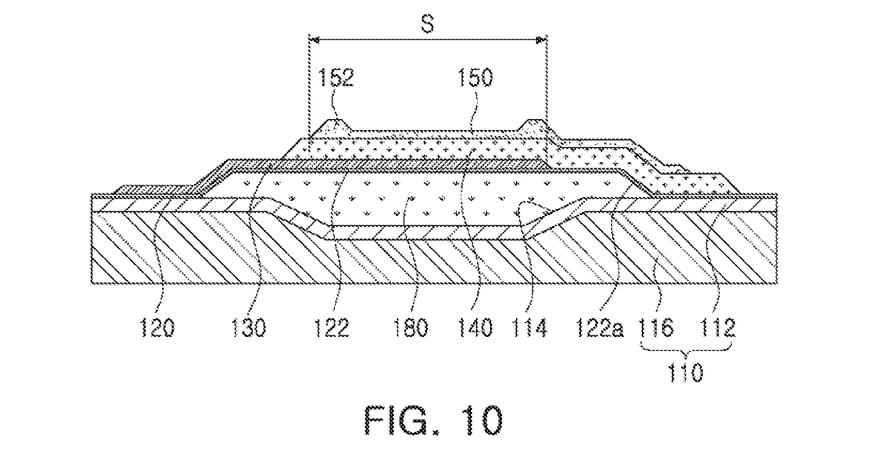

Then, as illustrated in FIG. 10, an upper electrode 150 is formed on the piezoelectric layer 140. The upper electrode 150 is provided with a frame portion 152 formed thereon, and the frame portion 152 is formed to be disposed at an edge of an active region S.

Figure 11:
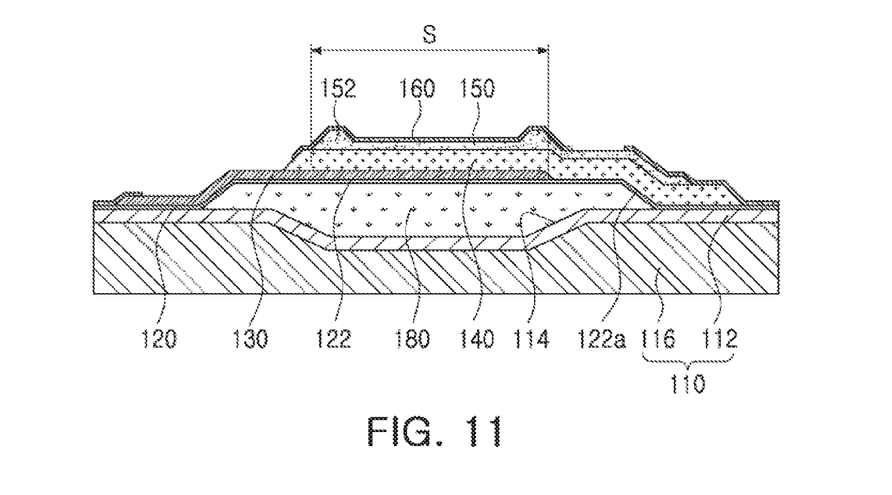

Then, as illustrated in FIG. 11, a passivation layer 160 is formed such that a portion of the upper electrode 150 and a portion of the lower electrode 130 are externally exposed.

Figure 12:
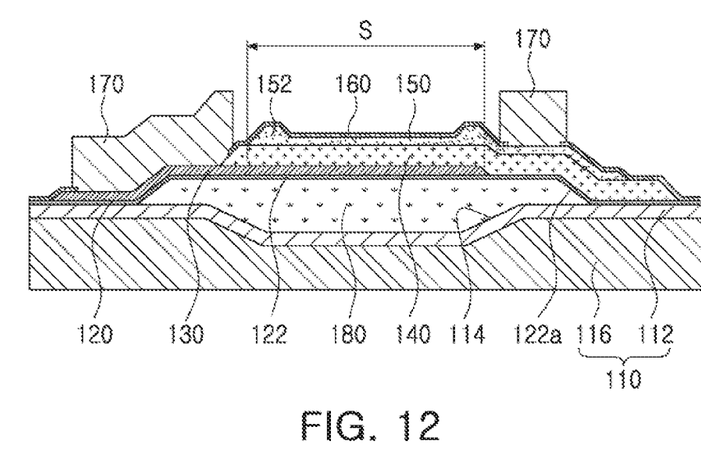

Subsequently, as illustrated in FIG. 12, a metal pad 170 is formed on the exposed portions of the lower electrode 130 and the upper electrode 150.

Figure 13:
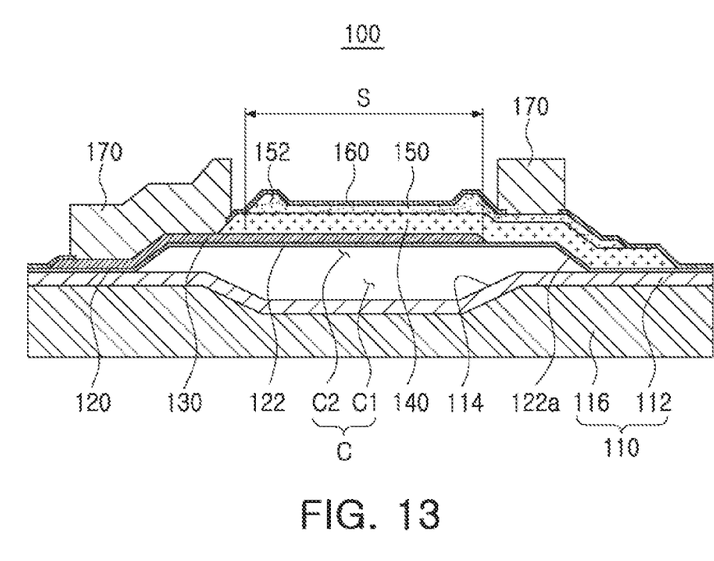

Then, a cavity C is formed by removing the sacrificial layer 180 as illustrated in FIG. 13. The cavity C includes a first space C1 formed by the cavity groove 114, and a second space C2 formed by the convex portion 122 of the membrane layer 120.

As described above, stiction between the substrate 110 and the membrane layer 120 is prevented via the cavity C of which a volume is increased compared to existing bulk acoustic wave resonators. For example, as the volume of the cavity C is increased through the cavity groove 114 formed in the substrate 110, the membrane layer 120 is prevented from being stuck to the substrate 110. In other words, stiction between the membrane layer 120 and the substrate 110 is prevented.

In addition, even when the volume of the cavity C increases, the occurrence of a problem due to an increase in a thickness of the sacrificial layer 180 (see FIG. 4) in a fabrication process may be prevented. For example, even when the volume of the cavity C increases, a length of an inclined surface of the sacrificial layer 180 is prevented from increasing due to the increase in a thickness of the sacrificial layer.

Figure 14:
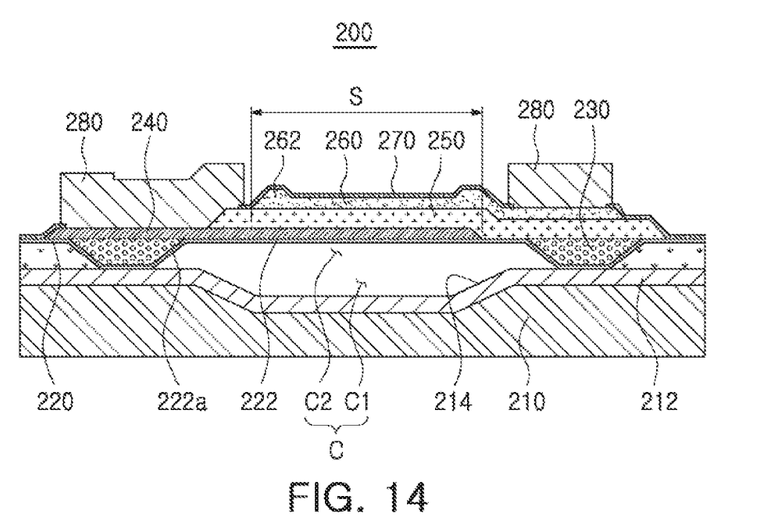
FIG. 14 is a schematic cross-sectional view of a bulk acoustic wave resonator, according to an example.

FIG. 14 is a schematic cross-sectional view of a bulk acoustic wave resonator, according to an example.

Referring to FIG. 14, a bulk acoustic wave resonator 200, according to an example, includes a substrate 210, a membrane layer 220, a support layer 230, a lower electrode 240, a piezoelectric layer 250, an upper electrode 260, a passivation layer 270, and a metal pad 280, by way of example.

The substrate 210 may be a silicon-accumulated substrate. For example, a silicon wafer may be used as the substrate. The substrate 210 is provided with a substrate protective layer 212 thereon to prevent damage to the substrate 210 when a cavity C is formed. The substrate protective layer 212 serves to prevent the substrate 210 from being etched during a process of removing a sacrificial layer 290 (see FIGS. 16 to 22), to be later described.

A cavity formation groove or a cavity groove 214 is formed in the substrate 210. The cavity groove 214 prevents stiction between a membrane layer 220 and the substrate 210 during resonance of the membrane layer 220, to be later described.

For example, the stiction between the membrane layer 220 and the substrate 210 during the resonance of a resonant portion is prevented through the cavity groove 214 formed to be recessed from the substrate 210.

The cavity groove 214 is disposed below an active region S to prevent stiction between the membrane layer 220 and the substrate 210 when the resonant portion vibrates.

In this case, the active region S refers to a region in which all three layers of the lower electrode 240, the piezoelectric layer 250, and the upper electrode 260 are laminated. The resonant portion refers to a region in which vibrations are generated, and refers to a region corresponding to the active region S.

Further, the cavity groove 214 is formed to be tapered. A first space C1 is formed through the cavity groove 214. As described above, because the first space C1 forming the cavity C is formed through the cavity groove 214, the occurrence of a problem due to an increase in a thickness of the sacrificial layer 290 during a fabrication process is prevented. For example, a length of an inclined surface of the sacrificial layer 290 is prevented from increasing due to the increase in a thickness of the sacrificial layer.

In addition, the cavity groove 214 has a size corresponding to a size of the active region S.

The membrane layer 220 is formed on the substrate 210 and has a convex portion 222. The convex portion 222 and the substrate 210 form a second space C2. The cavity C includes the first space C1 formed by the cavity groove 214, and the second space C2 formed by the convex portion 222.

Further, an edge or a portion of the convex portion 222 is formed to have an inclined surface 222a. In an example, the inclined surface 222a is formed at both ends of the second space C2 formed by the convex portion 222.

In addition, the membrane layer 220 is formed to cover the sacrificial layer 290 in a fabrication process, and then, the second space C2 is formed below the membrane layer 220 by removal of the sacrificial layer 290.

The membrane layer 220 is formed of a material having low reactivity to a halide-based etching gas such as fluorine (F), chlorine (Cl) or the like to remove the silicon-based sacrificial layer 180.

In one example, a volume of the first space C1 is formed to be greater than a volume of the second space C2. Thus, the resonant portion may stably resonate, and simultaneously therewith, stiction between the membrane layer 220 and the substrate 210 is prevented during resonance of the resonant portion.

The support layer 230 is formed to be disposed around the convex portion 222 of the membrane layer 220. The support layer 230 enables a lower electrode 240, to be described later, to be formed on a flat surface.

For example, the bulk acoustic wave resonator 200, according to an example, is a flat-type resonator.

The support layer 230 may be formed of a material including silicon nitride (SiN) or silicon oxide ($SiO_2$) as an example, but a material of the support layer 230 is not limited thereto. Thus, the support layer 230 may be formed of a material which is not damaged when the sacrificial layer 290 (see FIG. 16) to be described later is removed. In other words, the support layer 230 may be formed of a material that is not damaged by halide-based etching gas.

The lower electrode 240 is formed on the membrane layer 220, and at least a portion of the lower electrode 240 is located above the cavity C. As an example, the lower electrode 240 is formed using a conductive material, such as molybdenum (Mo), ruthenium (Ru), tungsten (W), iridium (Ir), platinum, and the like, or alloys thereof.

The lower electrode 240 is used as either an input electrode or an output electrode, receiving or providing an electrical signal, such as a radio frequency (RF) signal or the like. For example, when the lower electrode 240 is an input electrode, the upper electrode 260 is an output electrode, and when the lower electrode 240 is an output electrode, the upper electrode 260 is an input electrode.

The piezoelectric layer 250 is formed to cover at least a portion of the lower electrode 240. The piezoelectric layer 250 converts a signal input through the lower electrode 240 or the upper electrode 260 into an acoustic wave. For example, the piezoelectric layer 250 converts electrical signals into acoustic waves through physical vibration.

As an example, the piezoelectric layer 250 is formed by depositing aluminum nitride, doped aluminum nitride, zinc oxide, or lead zirconate titanate.

In addition, when the piezoelectric layer 250 is formed of aluminum nitride (AlN), the piezoelectric layer 250 may further include a rare earth metal. For example, as the rare earth metal, at least one of scandium (Sc), erbium (Er), yttrium (Y), and lanthanum (La) is used. In addition, when the piezoelectric layer 250 is formed of aluminum nitride (AlN), the piezoelectric layer 250 may further include a transition metal. For example, as the transition metal, at least one of zirconium (Zr), titanium (Ti), magnesium (Mg), and hafnium (Hf) is used.

The upper electrode 260 is formed to cover the piezoelectric layer 250, and is formed using a conductive material, such as molybdenum (Mo), ruthenium (Ru), tungsten (W), iridium (Ir), platinum (Pt), or the like, or alloys thereof, in a manner similar to the case of the lower electrode 240.

On the other hand, a frame portion 262 is disposed on the upper electrode 260. The frame portion 262 refers to a portion of the upper electrode 260, having a thickness greater than a thickness of a remaining portion of the upper electrode 260. The frame portion 262 is disposed on the upper electrode 260, in such a manner that the frame portion is disposed in a region of the active region S excluding a central portion of the active region S, for instance, at an edge of the active region S.

The frame portion 262 serves to reflect lateral waves generated during resonance to an inside of the active region S, to confine resonance energy in the active region S. In other words, the frame portion 262 is disposed at an edge of the active region S, to prevent vibrations from escaping externally from the active region S.

A passivation layer 270 is formed at least on the piezoelectric layer 250 and the upper electrode 260. For example, the passivation layer 270 is formed in a region on which the metal pad 280 is formed, except for portions of the lower electrode 240 and the upper electrode 260.

In addition, a thickness of the passivation layer 270 is adjusted by etching performed in an ultimate process to control a passing-frequency band.

The metal pad 280 is formed on portions of the lower electrode 240 and the upper electrode 260, on which the passivation layer 270 is not formed. As an example, the metal pad 280 is formed of a material, such as gold (Au), a gold-tin (Au—Sn) alloy, copper (Cu), a copper-tin (Cu—Sn) alloy, or the like.

As described above, stiction between the substrate 210 and the membrane layer 220 is prevented via the cavity C of which a volume is increased. For example, as the volume of the cavity C is increased through the cavity groove 214 formed in the substrate 210, the membrane layer 220 is prevented from being stuck to the substrate 210. In other words, stiction between the membrane layer 220 and the substrate 210 is prevented.

In addition, even when the volume of the cavity C increases, the occurrence of a problem due to an increase in a thickness of the sacrificial layer 290 (see FIG. 4) in a fabrication process is prevented. For example, a length of an inclined surface of the sacrificial layer 290 is prevented from increasing due to the increase in a thickness of the sacrificial layer while increasing the volume of the cavity C.

As a result, an increase in the size of the bulk acoustic wave resonator 200 is reduced, thereby suppressing an increase in an overall size of a filter device. Furthermore, characteristic deterioration is prevented from occurring due to an increase in a length of a connection portion between the bulk acoustic wave resonators 200.

FIGS. 15 to 23 are process drawings illustrating a method of manufacturing a bulk acoustic wave resonator, according to an example.

Figure 15:
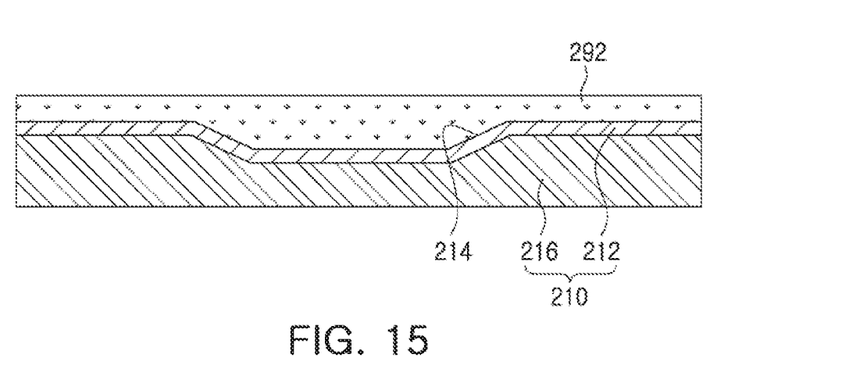
FIGS. 15 to 23 are process drawings illustrating a method of manufacturing a bulk acoustic wave resonator, according to an example.

As illustrated in FIG. 15, a sacrificial layer portion or a sacrificial layer formation portion 292 is formed on a substrate protective layer 212. The sacrificial layer portion 292 is also formed to be inserted into a cavity groove 214.

The sacrificial layer portion 292 is formed of, for example, a material containing polysilicon or silicon oxide.

A planarization process of the sacrificial layer portion 292 is performed. The planarization process is performed by chemical mechanical polishing (CMP).

Figure 16:
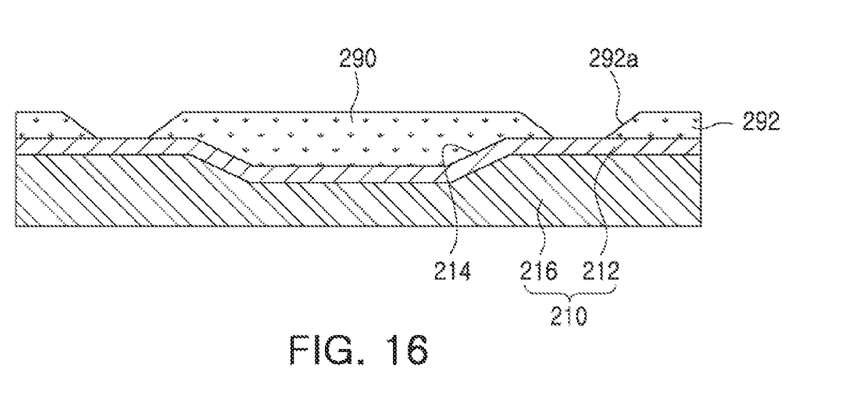

Subsequently, as illustrated in FIG. 16, a sacrificial layer 290 is formed through patterning of the sacrificial layer portion 292. For example, a depression groove 292a is formed in the sacrificial layer portion 292 to form the sacrificial layer 290.

Figure 17:
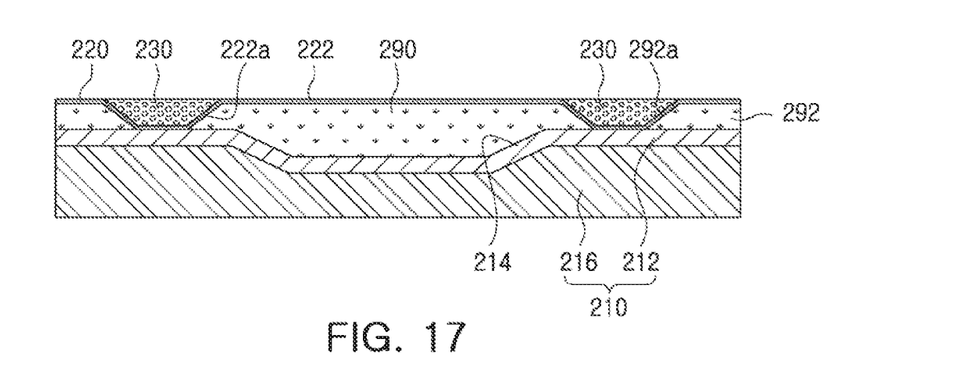

Further, as illustrated in FIG. 17, a membrane layer 220 is formed. The membrane layer 220 is formed to cover the sacrificial layer 290, and thus, a convex portion 222 is formed on the membrane layer 220. The convex portion 222 has an inclined surface 222a.

A support layer 230 is formed in the depression groove 292a formed in the sacrificial layer portion 292. Subsequently, a planarization process is performed via chemical mechanical polishing (CMP).

Figure 18:
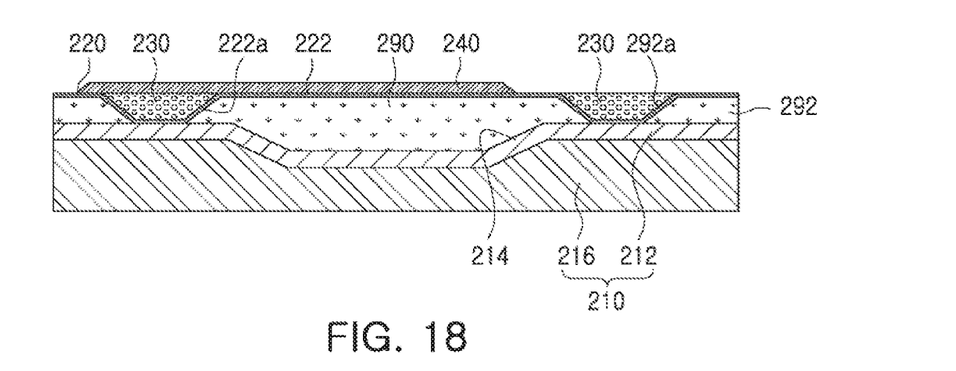

In addition, as illustrated in FIG. 18, a lower electrode 240 is formed on the membrane layer 220 so that a portion of the lower electrode 240 is disposed above the sacrificial layer 290. The lower electrode 240 is formed to extend outwardly of the sacrificial layer 290. Because a flat surface extending from an upper surface of the sacrificial layer 290 is formed by the support layer 230, the lower electrode 240 is formed to have a flat shape.

Figure 19:
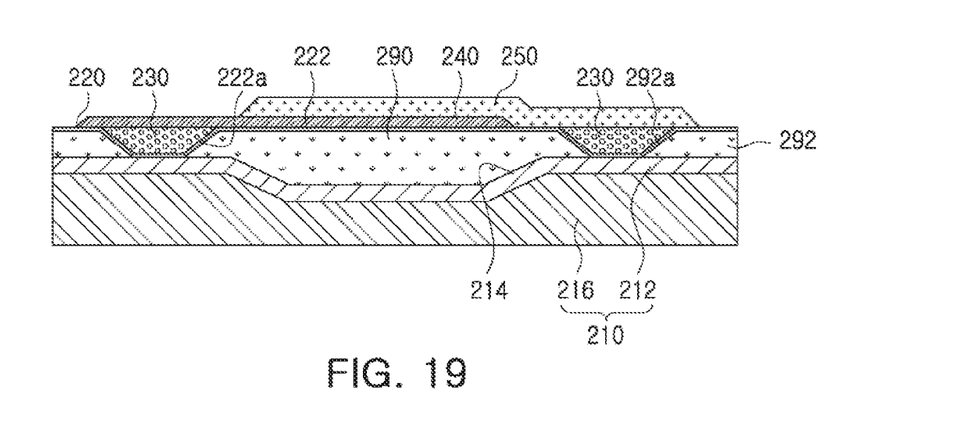

Subsequently, as illustrated in FIG. 19, a piezoelectric layer 250 is formed. The piezoelectric layer 250 is formed such that a portion thereof is disposed above the sacrificial layer 290. The portion of the piezoelectric layer 250 disposed above the sacrificial layer 290 is formed on the lower electrode 240.

Figure 20:
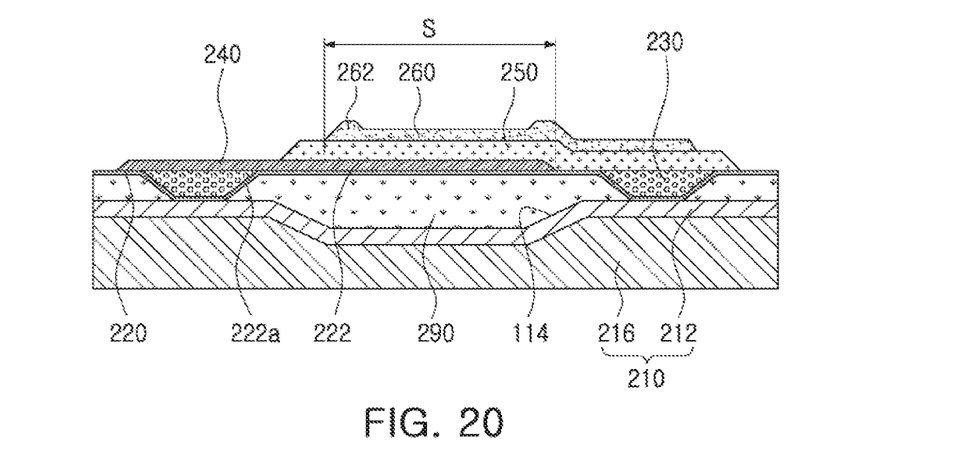

As illustrated in FIG. 20, an upper electrode 260 is formed on the piezoelectric layer 250. The upper electrode 260 is provided with a frame portion 262 formed thereon, and the frame portion 262 is formed to be disposed at an edge of an active region S.

Figure 21:
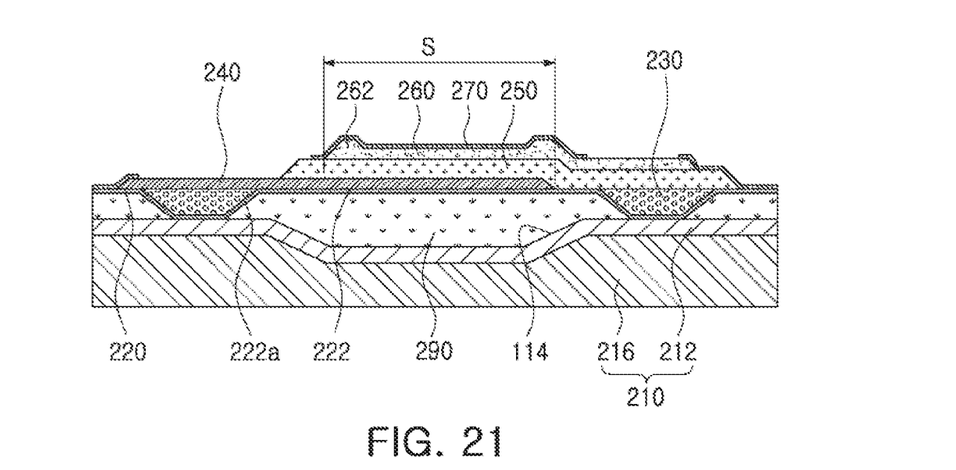

Then, as illustrated in FIG. 21, a passivation layer 270 is formed so that a portion of the upper electrode 260 and a portion of the lower electrode 240 are externally exposed.

Figure 22:
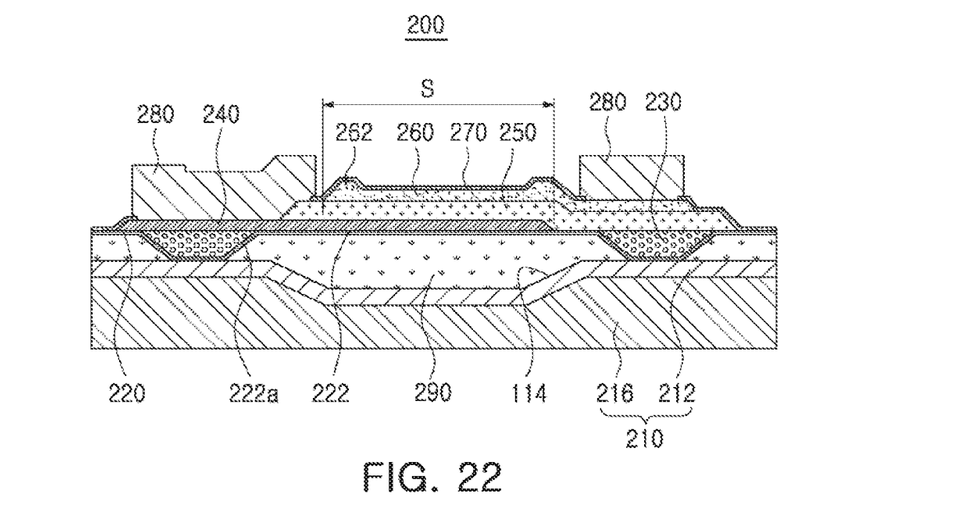

Subsequently, as illustrated in FIG. 22, a metal pad 280 is formed on the exposed portions of the lower electrode 240 and the upper electrode 260.

Figure 23:
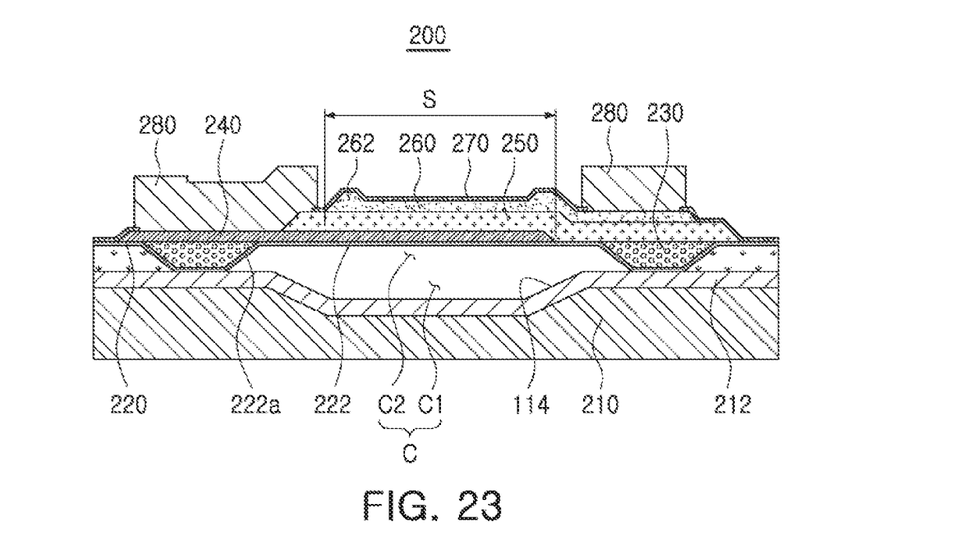

Then, a cavity C is formed by removing the sacrificial layer 290 as illustrated in FIG. 23. The cavity C includes a first space C1 formed by the cavity groove 214, and a second space C2 formed by the convex portion 222 of the membrane layer 220.

As described above, stiction between the substrate 210 and the membrane layer 220 is prevented via the cavity C of which a volume is increased compared to existing bulk acoustic resonators. For example, as the volume of the cavity C is increased through the cavity groove 214 formed in the substrate 210, stiction between the membrane layer 220 and the substrate 210 is prevented.

In addition, even when the volume of the cavity C increases, the occurrence of a problem due to an increase in a thickness of the sacrificial layer 290 in a fabrication process is prevented. For example, a length of an inclined surface of the sacrificial layer 290 is prevented from increasing due to the increase in a thickness of the sacrificial layer while increasing the volume of the cavity C.

As set forth above, according to examples, stiction between a substrate and a membrane layer is prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
   a substrate comprising a cavity groove;
   a membrane layer disposed above the substrate and comprising a convex portion;
   a lower electrode comprising a portion thereof disposed on the convex portion;
   a piezoelectric layer configured so that a portion of the piezoelectric layer is disposed above the convex portion; and
   an upper electrode disposed on the piezoelectric layer,
   wherein a first space formed by the cavity groove and a second space formed by the convex portion form a cavity, the cavity groove is disposed below an active region, and the convex portion comprises an inclined surface disposed outside of the cavity groove.

2. The bulk acoustic wave resonator of claim 1, wherein the cavity groove is sized to be disposed in a central portion of the active region.

3. The bulk acoustic wave resonator of claim 1, wherein the cavity groove is configured to have a size corresponding to the convex portion.

4. The bulk acoustic wave resonator of claim 1, wherein the convex portion comprises a support layer formed therearound so that the lower electrode is disposed on a flat surface.

5. The bulk acoustic wave resonator of claim 4, wherein the support layer is formed of a material comprising silicon nitride (SiN) or silicon oxide (SiO2) or a material comprising relatively low reactivity to a halide-based etching gas.

6. The bulk acoustic wave resonator of claim 1, further comprising:
   a metal pad configured to be connected to a portion of the lower electrode and a portion of the upper electrode; and
   a passivation layer disposed on the lower electrode excluding a region in which the metal pad is formed.

7. The bulk acoustic wave resonator of claim 1, wherein the upper electrode is provided with a frame portion formed thereon so that the frame portion is disposed at an edge of the active region.

8. The bulk acoustic wave resonator of claim 1, wherein a volume of the first space is greater than a volume of the second space.

9. The bulk acoustic wave resonator of claim 1, wherein the active region comprises a region in which the lower electrode, the piezoelectric layer, and the upper electrode are laminated.

10. A method of manufacturing a bulk acoustic wave resonator, comprising:
    forming a cavity groove in a substrate;
    forming a substrate protective layer on the substrate;
    forming a sacrificial layer portion on the substrate protective layer;

forming a sacrificial layer by removing a portion of the sacrificial layer portion;
forming a membrane layer to cover the sacrificial layer;
forming a resonant portion on the membrane layer; and
forming a cavity by removing the sacrificial layer,
wherein the membrane layer comprises a convex portion, the convex portion comprising an inclined surface.

11. The method of claim 10, wherein the forming a resonant portion comprises:
forming a lower electrode on the membrane layer so that a portion of the lower electrode is disposed above the sacrificial layer;
forming a piezoelectric layer above the sacrificial layer to cover a portion of the lower electrode;
forming an upper electrode on the piezoelectric layer;
forming a passivation layer to expose a portion of the lower electrode and a portion of the upper electrode; and
forming a metal pad on the exposed portion of the lower electrode and the exposed portion of the upper electrode.

12. The method of claim 10, wherein the forming a sacrificial layer comprises:
planarizing an upper surface of the sacrificial layer portion; and
removing a portion of the sacrificial layer portion, excluding a region thereof remaining as the sacrificial layer.

13. The method of claim 10, wherein the forming a sacrificial layer comprises:
planarizing an upper surface of the sacrificial layer portion; and
forming a depression groove in the sacrificial layer portion and around the sacrificial layer.

14. The method of claim 13, further comprising:
forming a support layer in the depression groove.

15. The method of claim 10, wherein the forming of the cavity comprises forming a first space by the cavity groove and forming a second space by flail the convex portion of the membrane layer.

16. The method of claim 15, wherein the cavity groove is sized to be disposed in a central portion of an active region.

17. The method of claim 10, wherein the cavity groove is formed to have a size corresponding to a size of the convex portion.

18. The method of claim 10, wherein the upper electrode comprises a frame portion formed thereon so that the frame portion is disposed at an edge of an active region.

19. The method of claim 10, further comprising:
forming an active region in a region in which the lower electrode, the piezoelectric layer, and the upper electrode are laminated.

20. A method of manufacturing a bulk acoustic wave resonator, comprising:
forming a cavity groove in a substrate;
forming a substrate protective layer on the substrate;
forming a sacrificial layer portion on the substrate protective layer;
forming a sacrificial layer by removing a portion of the sacrificial layer portion;
forming a membrane layer to cover the sacrificial layer;
forming a resonant portion on the membrane layer;
forming a cavity by removing the sacrificial layer;
planarizing an upper surface of the sacrificial layer portion; and
forming a depression groove in the sacrificial layer portion and around the sacrificial layer.

* * * * *